(12) United States Patent
Smetana

(10) Patent No.: US 6,198,309 B1
(45) Date of Patent: *Mar. 6, 2001

(54) EMITTER FOLLOWER OUTPUT WITH PROGRAMMABLE CURRENT

(75) Inventor: Kenneth Smetana, San Diego, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/282,883

(22) Filed: Mar. 31, 1999

(51) Int. Cl.[7] .................................................. H03K 19/086
(52) U.S. Cl. ................................ 326/126; 326/68; 326/78
(58) Field of Search .................................... 326/66, 67, 73, 326/74, 77, 78, 126

(56) References Cited

U.S. PATENT DOCUMENTS

| | | | |
|---|---|---|---|
| 3,760,200 | 9/1973 | Taniguchi et al. | 307/303 |
| 3,909,636 | 9/1975 | Masaki et al. | 307/303 |
| 4,675,555 | 6/1987 | Okajima et al. | 307/455 |
| 4,945,263 | 7/1990 | Estrada | 307/475 |
| 4,988,899 | 1/1991 | Jansson | 307/475 |
| 5,041,747 | * 8/1991 | Chengson et al. | 307/591 |
| 5,072,136 | 12/1991 | Naghshineh | 307/455 |
| 5,302,892 | * 4/1994 | Tada et al. | 324/158 R |
| 5,304,856 | 4/1994 | Rainal | 307/270 |
| 5,323,068 | 6/1994 | Freitas | 307/455 |
| 5,510,729 | 4/1996 | Reymond | 326/33 |
| 5,656,952 | 8/1997 | McCall et al. | 326/82 |

* cited by examiner

Primary Examiner—Michael Tokar
Assistant Examiner—Anh Tran
(74) Attorney, Agent, or Firm—Gary Cary Ware & Friedenrich

(57) ABSTRACT

An integrated circuit device having emitter follower outputs with adjustable output currents includes a variable bias generator that produces a bias voltage. The bias voltage is connected to the bases of current source transistors in order to program the output currents. The variable bias generator is connected to an electrical connection area of the integrated circuit device. An external programming circuit can be connected to the electrical connection area in order to set the bias voltage, to thereby program the desired amount of current in the output current sources. The external programming circuit typically can be a resistance or an external voltage source. The variable bias generator can be any of a number of circuits that produce a bias voltage that is dependent upon the external programming circuit connected to the electrical connection area. Another aspect of the invention is a method for optimizing circuit parameters by programming the output currents in an integrated circuit device having emitter follower outputs. The invention provides the ability to program the output currents to advantageously save power and prevent unnecessary heat generation, while maintaining one or more circuit parameters, such as propagation delay, waveform integrity, or jitter, at or above a target value.

24 Claims, 7 Drawing Sheets

EMITTER FOLLOWER OUTPUT WITH PROGRAMMABLE CURRENT

CROSS REFERENCE TO RELATED APPLICATION

This application contains subject matter related to the following co-pending U.S. Patent Application, which is incorporated by reference herein: U.S. patent application Ser. No. 09/253,621, filed Feb. 19, 1999, titled "Output Buffer with Programmable Voltage Swing", of Smetana (the same inventor as the instant application), which is assigned to the same assignee as the instant application.

BACKGROUND OF THE INVENTION

1. Field of the Invention

The invention relates to emitter follower outputs. More particularly, the invention concerns an integrated circuit having emitter follower outputs and an electrical connection area that is connectable to an external circuit to program the amount of current in the emitter follower outputs.

2. Description of the Related Art

Figure 1:
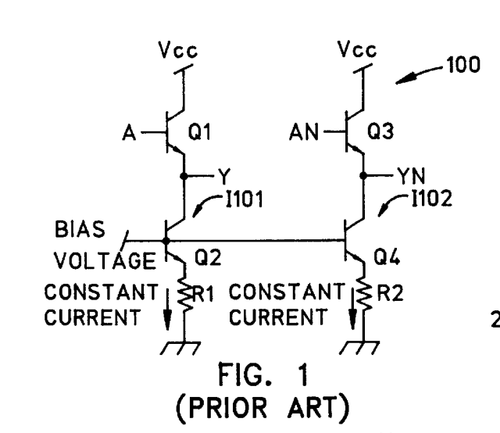
FIG. 1 is a schematic diagram of a prior art buffer that has emitter follower outputs.

Emitter follower output stages are common components of digital logic circuitry. FIG. 1 illustrates a typical prior art buffer circuit 100 that has emitter follower outputs. In the circuit of FIG. 1, the emitter of output transistor Q1 is connected to output Y, and the emitter of output transistor Q3 is connected to complimentary output YN. The output current I101 for output Y is set by a constant current source consisting of transistor Q2 and resistor R1. Similarly, the output current I102 through output YN is set by a constant current source consisting of transistor Q4 and resistor R2. Output currents I101 and 102, which are also referred to as output drive currents, primarily affect voltage fall times.

When an integrated circuit including a circuit such as circuit 100 is designed, the output currents of the circuit 100 are essentially fixed, except for resistor sheet resistance variation. Once a circuit such as circuit 100 is fabricated, the output currents are fixed. The bias voltage applied to the bases of current source transistors Q2 and Q4 is constrained to a range of values, which sets the output currents of the emitter follower outputs at fixed values.

The fixed output currents in emitter follower outputs such as the outputs of the circuit 100 in FIG. 1 are typically set high enough to ensure satisfactory performance for a wide range of applications under worse case conditions, also taking into account imprecision in the output currents that may result due to manufacturing process tolerances. For example, the output currents are set high enough to adequately minimize propagation delay times and setup and hold times, and to maximize "eye openings," in a variety of applications. A significant shortcoming of these prior art emitter follower output circuits is that many applications do not require output currents that are as large as the output currents provided by these circuits. Consequently, in many applications a substantial amount of power is wasted and a corresponding amount of heat is needlessly generated due to the excessive output currents provided by these circuits. Conversely, some applications may require output currents that are greater that the fixed output currents that are provided.

SUMMARY OF THE INVENTION

Broadly, the invention concerns an integrated circuit having emitter follower outputs with adjustable output drive currents. The integrated circuit includes an electrical connection area that is connectable to an external circuit to program the amount of current in the emitter follower outputs.

Figure 3:
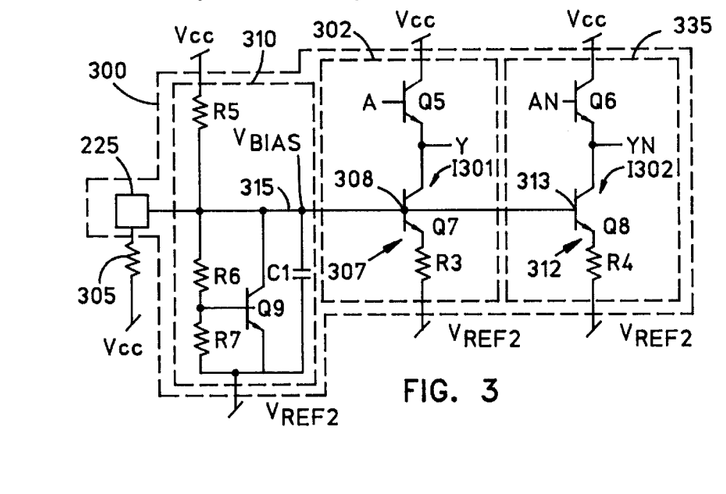
FIG. 3 is a schematic diagram of an integrated circuit device in accordance with an illustrative embodiment of the invention, connected to an external programming circuit.

An illustrative embodiment of the invention is shown in FIG. 3. Like the prior art circuit 100 of FIG. 1, the integrated circuit device 300 of FIG. 3 includes a pair of emitter follower output transistors and their corresponding current sources. In FIG. 3, current source transistor Q7 and current source resistor R3 are connected to emitter follower output transistor Q5, and current source transistor Q8 and current source resistor R4 are connected to emitter follower output transistor Q6. In contrast to the prior art circuit 100 shown in FIG. 1, in which the output drive currents I101 and I102 are fixed because a constrained bias voltage is applied to the bases of the current source transistors, in the integrated circuit device 300 of FIG. 3 the output drive currents I301 and I302 are programmable because the voltage applied to the bases of the current source transistors Q7 and Q8 is selectable. Within the operational range of the circuit, the output currents are programmed to be as low or high as required for a particular application. Programming the output currents also allows for reduction or elimination of excess output current introduced due to manufacturing tolerances. Usually, the output currents are set as low as is possible without adversely affecting circuit performance. For example, the output currents may be set as low as possible while maintaining one or more circuit parameters, such as propagation delay, waveform integrity, or jitter, at or above a target value.

In order to program the output drive currents I301 and I302, the integrated circuit device 300 of FIG. 3 includes a variable bias generator 310 that produces a bias voltage that is connected to the bases of the current source transistors Q7 and Q8. The output drive currents I301 and I302 are determined by the bias voltage. The variable bias generator is connected to an electrical connection area 225 of the integrated circuit device 300. An external programming circuit can be connected to the electrical connection area in order to adjust (also referred to as setting) the bias voltage, to thereby program the desired output drive currents. The external programming circuit, which is shown in FIG. 3 as a resistance 305, can be a resistance or an external voltage source (and could be other types of components in other embodiments). The variable bias generator can be any of a number of circuits that produce a bias voltage that is a function of the external programming circuit connected to the electrical connection area. If power conservation is not important, or if emitter follower output current reduction (or output current augmentation) is otherwise not needed, then an external programming circuit is not connected to the electrical connection area. In this case the electrical connection area is left floating, and consequently the output currents have their nominal default values.

The invention can be implemented in various embodiments, including as an integrated circuit device with programmable emitter follower output currents, and as a method for optimizing circuit parameters by programming emitter follower output currents in an integrated circuit device.

The invention affords its users with a number of distinct advantages. Chiefly, the invention provides the ability to program the output currents in emitter follower outputs on integrated circuits to increase, or more typically, to decrease the output currents. The output currents can be adjusted to not be any larger than is required for a particular application, while maintaining one or more circuit parameters, such as propagation delay, waveform integrity, or jitter, at or above a target value. This provides the benefits of not wasting power and not generating unnecessary heat, which would otherwise occur due to excessive output currents. The invention allows the internal emitter follower output currents to be adjusted easily "on the fly," and if necessary, to be readjusted for performance/power optimization. The invention also provides other advantages and benefits, which are apparent from the following description.

DETAILED DESCRIPTION OF THE PREFERRED EMBODIMENTS

The nature, objects, and advantages of the invention will become more apparent to those skilled in the art after considering the following detailed description in connection with the accompanying drawings.

The invention concerns an integrated circuit device having emitter follower outputs and an electrical connection area that is connectable to an external programming circuit to program the amount of current in the emitter follower outputs. The invention can be implemented in various embodiments, including as an integrated circuit device with programmable emitter follower output currents, and as a method for optimizing circuit parameters by programming emitter follower output currents in an integrated circuit device.

HARDWARE COMPONENTS AND INTERCONNECTIONS

A. Single Output

Figure 2:
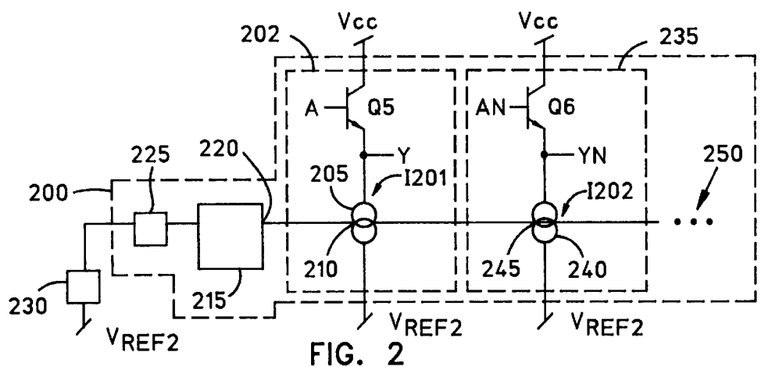
FIG. 2 is a block/schematic diagram of an integrated circuit device in accordance with an illustrative embodiment of the invention, connected to an external programming circuit.

FIG. 2 is a block/schematic diagram of the circuitry of an integrated circuit device 200 in accordance with an illustrative embodiment of the invention, connected to an external programming circuit 230. Integrated circuit device 200 includes a first emitter follower output section 202. The first emitter follower output section 202 includes first emitter follower output transistor Q5 and a first current source 205. An input A is connected to the base of transistor Q5. The collector of transistor Q5 is connected to a first voltage (also referred to as a first reference voltage), which is typically referred to as Vcc. The emitter of transistor Q5 is connected (to a first end of the first current source 205) in series with the first current source 205. First current source 205 has a bias voltage input 210 for controlling the amount of current through the first current source 205. A second end of the first current source 205 is connected to a second voltage (also referred to as a second reference voltage), which is preferably ground.

The integrated circuit device 200 also includes a variable bias generator 215 that has an output 220. The variable bias generator 215 produces a bias voltage at the output 220 of the variable bias generator. The output 220 of the variable bias generator 215 is connected to the bias voltage input 210 of the first current source 205 for controlling the amount of current through the first current source 205.

The integrated circuit device 200 also includes an electrical connection area 225 that is connected to the variable bias generator 215. The electrical connection area 225 is configured for connection to an external programming circuit 230. If it is desired to change the output drive current I201 of output section 202 to a current other than the default value, an external programming circuit 230 is connected to the electrical connection area 225 to cause the bias voltage at the output of the variable bias generator to be set to a value other than the default bias voltage value. Changing the bias voltage causes the amount of current through the first current source to change. Thus, the external programming circuit is used to program the amount of current through the first current source. Adjusting the output current primarily affects the high to low transition "fall time" of the output. Adjusting the output current can also be described as adjusting the drive capability of the output. The output current can also be adjusted to optimize the performance of circuit parameters, for example, propagation delay, waveform integrity, or jitter.

When the external programming circuit is used, usually the external programming circuit is employed to reduce the bias voltage in order to reduce the output drive current I201 from a default output current value to a smaller output current value. However, the external programming circuit can also be used to cause an increase in the bias voltage to thereby increase the output current from the default value, which is useful if the default output current is not large enough for optimum performance.

The external programming circuit 230 can be any circuit that causes the bias voltage, which can also be referred to as a control voltage, to change from the default value to the desired value. Typically, the external programming circuit 230 is a resistance or an external voltage source. Preferably, the external programming circuit 230 is a resistance. The resistance may comprise one or more resistive components, and is preferably one resistor 305 as shown in FIG. 3. The amount of resistance used for the external programming circuit is a function of the desired output current and of the circuitry used for the variable bias generator 215. If it is desired to decrease the output current, the end of the resistance that is not connected to the electrical connection area is connected to ground. If it is desired to increase the bias voltage and the output current, the end of the resistance that is not connected to the electrical connection area is connected to Vcc.

In the alternative embodiment where the external programming circuit 230 is an external voltage source, the amount of voltage used for the external voltage source is a function of the desired output current and of the circuitry used for the variable bias generator 215. The voltage of the external voltage source can be adjusted over an operating range consistent with the value of the power supply. For example, if the integrated circuit device were to operate at 3.3 volts, then the voltage of the external voltage source could be set in a range from about 0.0 volts to about 3.3 volts, in order to select the desired value of output current. The desired voltage for the external voltage source can be obtained in a number of ways known in the art, for example with two resistors connected as a voltage divider across the power supply voltage. In another alternative embodiment, the variable bias generator could be designed for use with an external programming circuit that is a current source.

The first current source 205 can be any current source for which the amount of current through the current source is a function of the voltage at the bias voltage input 210. In the preferred embodiment 307 of the first current source shown in FIG. 3, first current source 307 consists of transistor Q7 and resistor R3. The current through this current source is determined by the voltage at the bias voltage input 308, and the value of resistor R3. Resistor R3 is connected in series with the emitter of transistor Q7, with one end of resistor R3 connected to the emitter of transistor Q7, and the other end of resistor R3 connected to a second voltage, which is preferably ground. In this preferred embodiment of the first current source 307, the base of transistor Q7 is the bias voltage input 308 of the first current source 307. Further, with this preferred embodiment of the first current source, the emitter of the first output transistor Q5 is connected to the collector of the first current source transistor Q7 at a first output node Y.

B. Complimentary Outputs

Preferably, integrated circuit device 200 also includes a second emitter follower output section 235, as shown in FIG. 2. The second emitter follower output section 235 includes second emitter follower output transistor Q6 and a second current source 240. An input AN is connected to the base of transistor Q6. Input AN is the logical compliment of the input A that is connected to the base of transistor Q5. The A and AN input signals are typically the outputs of preceding logic circuitry. The collector of transistor Q6 is connected to the first voltage, typically referred to as Vcc. The emitter of transistor Q6 is connected (to a first end of the second current source) in series with the second current source 240. Second current source 240 has a bias voltage input 245 for controlling the amount of current through the second current source 240. A second end of the second current source 240 is connected to the second voltage, which is preferably ground.

As mentioned above, the output 220 of the variable bias generator 215 is connected to the bias voltage input 210 of the first current source 205 for controlling the amount of current through the first current source 205. The output 220 of the variable bias generator 215 is also connected to the bias voltage input 245 of the second current source 240 for controlling the amount of current through the second current source 240. In alternative embodiments, the output 220 of the variable bias generator can be connected to the bias voltage inputs of more than two current sources in order to control the output currents of more than two outputs. Thus, a single electrical connection area can be used to control the current of several outputs. For example, in addition to connecting the bias voltage to the bias voltage inputs of emitter follower output sections 202 and 235, the bias voltage could also be connected to additional emitter follower output sections that are similar to emitter follower output sections 202 and 235, as indicated by the dots 250 in FIG. 2. Connecting a single bias voltage to the bias voltage inputs of several, or many, emitter follower outputs is preferred for many applications.

If it is desired to change the output current of the second output section 235 to a current other than the default value, the external programming circuit 230 is connected to the electrical connection area 225 to cause the bias voltage at the output 220 of the variable bias generator to be set to a value other than the default bias voltage value. Changing the bias voltage causes the amount of current through the second current source to change. Changing the bias voltage also causes the amount of current through the first current source to change. Thus, the external programming circuit is used to program the amount of current through the first current source and the second current source. Similarly, if the bias voltage is connected to the bias voltage inputs of more than two emitter follower outputs, then the external programming circuit is used to program the amount of current through all of the emitter follower outputs that are connected to the bias voltage.

Although not required, preferably the amount of current I201 through the first current source is about the same as the amount of current I202 through the second current source (and typically will be about the same as the amount of current through the current sources of any additional emitter follower output sections connected to the bias voltage). When the external programming circuit is used, usually the external programming circuit is employed to reduce the bias voltage in order to reduce the output drive currents I201 and I202 from default output current values to smaller values. The output currents can be adjusted to not be any larger than is required for a particular application, while maintaining one or more circuit parameters, such as propagation delay, waveform integrity, or jitter, etc., at or above a target value. As in the single output embodiment, the external programming circuit can also be used to increase the bias voltage to thereby increase the output currents, for example to establish the value of one or more circuit parameters, such as propagation delay, waveform integrity, or jitter, at or above a target value.

As with the first current source 205, the second current source 240 can be any current source for which the amount of current through the current source is a function of the voltage at the bias voltage input, which for the second current source is bias voltage input 245. In the preferred embodiment of the second current source shown in FIG. 3, the second current source 312 consists of transistor Q8 and resistor R4. The amount of current I302 through this current source is a function of the value of resistor R4, in addition to being a function of the voltage at the bias voltage input 313. Resistor R4 is connected in series with the emitter of transistor Q8, with one end of resistor R4 connected to the emitter of transistor Q8, and the other end of resistor R4 connected to a second voltage, which is preferably ground. In this preferred embodiment of the second current source 312, the base of transistor Q8 is the bias voltage input 313 of the second current source 312. Further, with this preferred embodiment of the second current source 312, the emitter of the second output transistor Q6 is connected to the collector of the second current source transistor Q8 at a second output node YN. The output signal at second output node YN is the logical compliment of the output signal at first output node Y.

C. Preferred Embodiment of the Variable Bias Generator

FIG. 3 illustrates the preferred embodiment of the integrated circuit device 300, including the preferred embodiment 310 of the variable bias generator 215 of FIG. 2. Preferred variable bias generator 310 includes a variable bias generator first resistor R5 that has a first end connected to the first voltage, and a second end connected to the electrical connection area 225. A variable bias generator second resistor R6 has a first end connected to the electrical connection area 225. A variable bias generator third resistor R7 has a first end connected to a second end of the variable bias generator second resistor R6, and a second end connected to the second voltage. A variable bias generator first transistor Q9 has a collector connected to the electrical connection area 225, a base connected to the second end of the variable bias generator second resistor R6 and to the first end of the variable bias generator third resistor R7, and an emitter connected to the second voltage. A variable bias generator capacitor C1 has a first end connected to the electrical connection area, and a second end connected to the second voltage. In this embodiment of the variable bias generator 310, the output 315 of the variable bias generator 310 is connected to the electrical connection area 225. The output 315 is also connected to the bias voltage inputs 308 and 313 of the first and second current sources 307 and 312. The bias voltage $V_{BIAS}$ is produced at the output 315.

D. First Alternative Embodiment of the Variable Bias Generator

Figures 4A, 5:
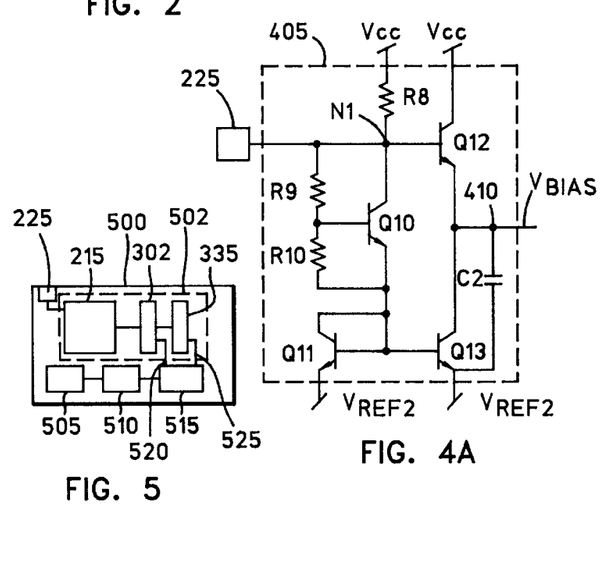
FIG. 4A is a schematic diagram of a variable bias generator and an electrical connection area in accordance with an illustrative embodiment of the invention.
FIG. 5 is a plan view of an integrated circuit device in accordance with an illustrative embodiment of the invention.

FIG. 4A illustrates a first alternative embodiment 405 of the variable bias generator 215 of FIG. 2. This alternative variable bias generator 405 includes a variable bias generator first resistor R8 that has a first end connected to the first voltage, and a second end connected to the electrical connection area 225. A variable bias generator second resistor R9 has a first end connected to the electrical connection area 225. A variable bias generator third resistor R10 has a first end connected to a second end of the variable bias generator second resistor R9. A variable bias generator first transistor Q10 has a collector connected to the electrical connection area 225, a base connected to the second end of the variable bias generator second resistor R9 and to the first end of the variable bias generator third resistor R10, and an emitter connected to a second end of the variable bias generator third resistor R10. A variable bias generator second transistor Q11 has a collector and a base that are connected to the emitter of the variable bias generator first transistor Q10 and to the second end of the variable bias generator third resistor R10, and an emitter that is connected to the second voltage. A variable bias generator third transistor Q12 has a collector connected to the first voltage, a base connected to the electrical connection area 225, and an emitter. A variable bias generator fourth transistor Q13 has a collector connected to the emitter of the variable bias generator third transistor Q12, a base connected to the base of the variable bias generator second transistor Q11, and an emitter connected to the second voltage. A variable bias generator capacitor C2 has a first end connected to the collector of variable bias generator fourth transistor Q13, and a second end connected to the second voltage. The output 410 of the variable bias generator 405 is connected to the emitter of the variable bias generator third transistor Q12 and to the collector of the variable bias generator fourth transistor Q13. The output 410 is preferably connected to the bias voltage inputs 308 and 313 of the first and second current sources 307 and 312. The bias voltage $V_{BIAS}$ is produced at the output 410.

E. Second Alternative Embodiment of the Variable Bias Generator

Figure 4B:
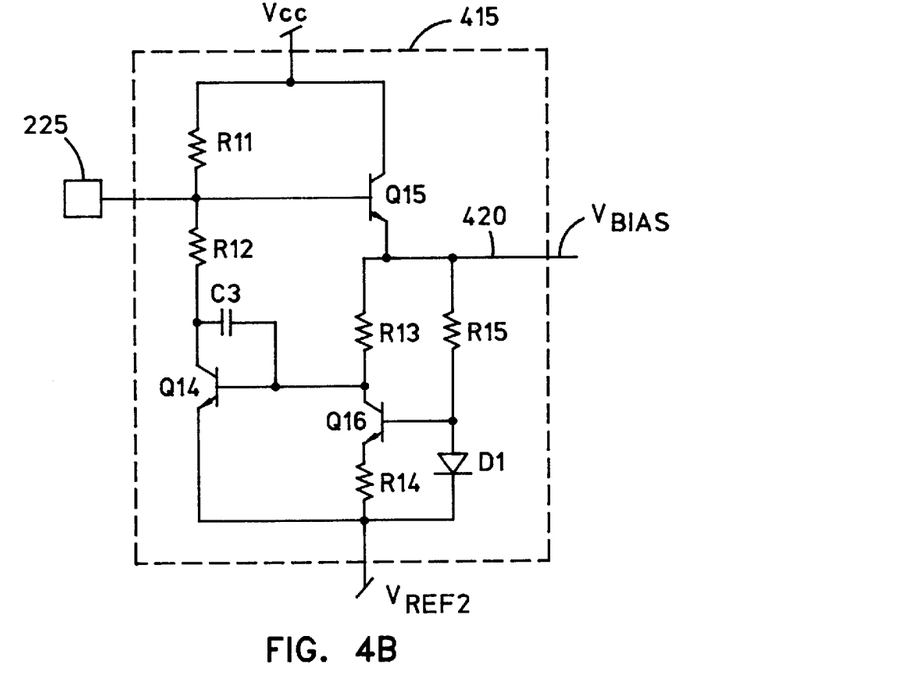
FIG. 4B is a schematic diagram of another variable bias generator and an electrical connection area in accordance with an illustrative embodiment of the invention.

FIG. 4B illustrates a second alternative embodiment 415 of the variable bias generator 215 of FIG. 2. This alternative variable bias generator 415 includes a variable bias generator first resistor R11 that has a first end connected to the first voltage, and a second end connected to the electrical connection area 225. A variable bias generator second resistor R12 has a first end connected to the electrical connection area 225. A variable bias generator capacitor C3 has a first end connected to a second end of the variable bias generator second resistor R12. A variable bias generator first transistor Q14 has a collector connected to the first end of the variable bias generator capacitor C3 and to the second end of the variable bias generator second resistor R12, a base connected to a second end of the variable bias generator capacitor C3, and an emitter connected to the second voltage. A variable bias generator second transistor Q15 has a collector connected to the first voltage, a base connected to the electrical connection area 225, and an emitter connected to an output 420 of the variable bias generator 415. A variable bias generator third resistor R13 has a first end connected to the output 420. A variable bias generator third transistor Q16 has a collector connected to a second end of the variable bias generator third resistor R13, a base, and an emitter. A variable bias generator fourth resistor R14 has a first end connected to the emitter of the variable bias generator third transistor Q16, and a second end connected to the second voltage. A variable bias generator fifth resistor R15 has a first end connected to the output 420, and a second end connected to the base of the variable bias generator third transistor Q16. A variable bias generator diode D1 has an anode connected to the base of the variable bias generator third transistor Q16, and a cathode connected to the second voltage. The output 420 is preferably connected to the bias voltage inputs 308 and 313 of the first and second current sources 307 and 312. The bias voltage $V_{BIAS}$ is produced at the output 420.

F. Third Alternative Embodiment of the Variable Bias Generator

Figure 4C:
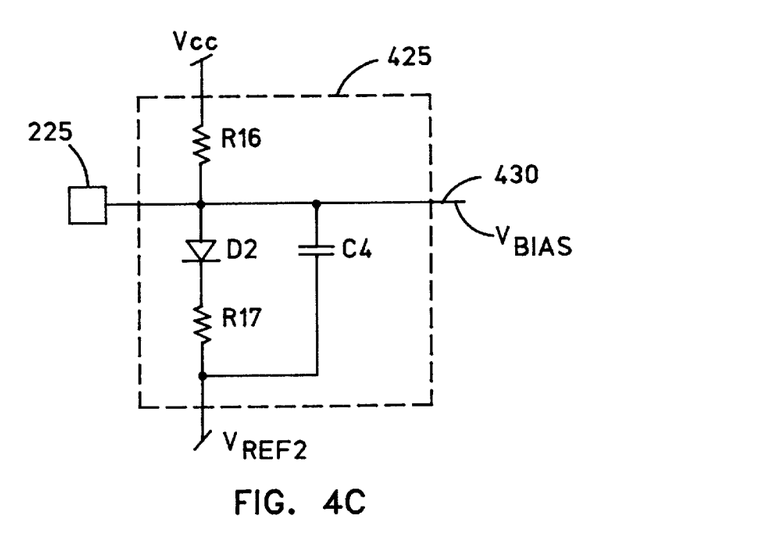
FIG. 4C is a schematic diagram of another variable bias generator and an electrical connection area in accordance with an illustrative embodiment of the invention.

FIG. 4C illustrates a third alternative embodiment 425 of the variable bias generator 215 of FIG. 2. This alternative variable bias generator 425 includes a variable bias generator first resistor R16 that has a first end connected to the first voltage, and a second end connected to the electrical connection area 225. A variable bias generator diode D2 has an anode connected to the electrical connection area 225, and a cathode. A variable bias generator second resistor R17 has a first end connected to the cathode of the variable bias generator diode, and a second end connected to the second voltage. A variable bias generator capacitor C4 has a first end connected to the electrical connection area 225, and a second end connected to the second voltage. An output 430 of the variable bias generator 425 is connected to the electrical connection area 225. The output 430 is preferably connected to the bias voltage inputs 308 and 313 of the first and second current sources 307 and 312. The bias voltage $V_{BIAS}$ is produced at the output 430.

G. Typical Component Values

The following values are illustrative of typical resistor and capacitor values used to implement the circuits described herein. However, these values are not required, and the circuits described herein may be implemented with component values other than, and in many cases substantially different than, the following illustrative component values. Illustrative values for resistors and capacitors shown in FIGS. 2, 3, 4A, 4B, 4C, and 4D are as follows:

R3=20 ohms
R4=20 ohms
R5=800 ohms
R6=500 ohms

R7=2K ohms
R8=500 ohms
R9=500 ohms
R10=2K ohms
R11=4K ohms
R12=2.5K ohms
R13=550 ohms
R14=50 ohms
R15=400 ohms
R16=2.2K ohms
R17=200 ohms
C1=2 picofarads
C2=2 picofarads
C3=2 picofarads
C4=2 picofarads

H. Plan View of Integrated Circuit Device

FIG. 5 shows an integrated circuit device 500, which can be made with any of a number of known integrated circuit manufacturing processes. Integrated circuit device 500 includes electrical connection area 225, and also includes the variable bias generator 215, the first emitter follower output section 302, and the second emitter follower output section 335. The electrical connection area 225 can be an electrically conducting pin, pad, or other type of conductive area. The variable bias generator 215, first emitter follower output section 302 (including current source 307) and the second emitter follower output section 335 (including current source 312) may cumulatively be referred to as a circuit 502. Circuit 502 and device 500 need not include second emitter follower output section 335, and may alternatively include additional emitter follower output sections.

Device 500 also preferably includes other circuits 505, 510, and 515, which can generally be any type of digital and/or analog circuits. Preferably, circuits 505, 510, and 515 are digital logic circuits. Circuit 515 is typically a digital logic circuit that is connected to emitter follower output sections 302 and 335. Signal line 520 connects circuit 515 to emitter follower output section 302, and signal line 525 connects circuit 515 to emitter follower output section 335. Signal line 520 preferably transmits signals from circuit 515 to input A of emitter follower output section 302. Similarly, signal line 525 preferably transmits signals from circuit 515 to input AN of emitter follower output section 335. The other circuits 505, 510, and/or 515 may be connected to additional emitter follower output sections that may optionally be included in circuit 502. Also, additional other circuits in addition to other circuits 505, 510, and 515 may be included in device 500, and one or more of these additional other circuits may be connected to additional emitter follower output sections that may optionally be included in circuit 502.

METHODS

In addition to the hardware embodiments described herein, another aspect of the invention concerns methods for optimizing a circuit parameter in an integrated circuit device having an electrical connection area. The circuit parameter is optimized by programming the output current (which may also be referred to as the output drive current) in an integrated circuit device having an emitter follower output. Although the methods may be practiced with any of a number of circuit configurations, for clarity of explanation, but with no limitation intended thereby, the tasks of the methods are described in the context of the circuits of FIGS. 2–5. Also, although the methods may be described in terms of optimizing a circuit parameter of a single emitter follower output, the methods may be used to optimize circuit parameters of one, two, or more respective emitter follower outputs, and are preferably used to optimize circuit parameters in one or more complimentary pairs of emitter follower outputs.

A. External Resistance

One aspect of the invention is a first method for optimizing a circuit parameter in an integrated circuit device having an electrical connection area. For this method, the external programming circuit 230 of FIG. 2 is a resistance, referred to as an external resistance. This method is illustrated by the tasks 600 of the flowchart in FIGS. 6A–6C. In task 605, a circuit parameter that is influenced by the emitter follower output current is selected for optimizations. Although this method is described in terms of optimizing one parameter, optionally, more than one parameter can be optimized. Circuit parameters that may be optimized include, for example, propagation delay, waveform integrity, and/or jitter. In task 610, a goal or target value for the selected parameter is defined (established). In task 615, a benchmark measurement of circuit performance is obtained by measuring the default value of the selected parameter.

Figure 6A:
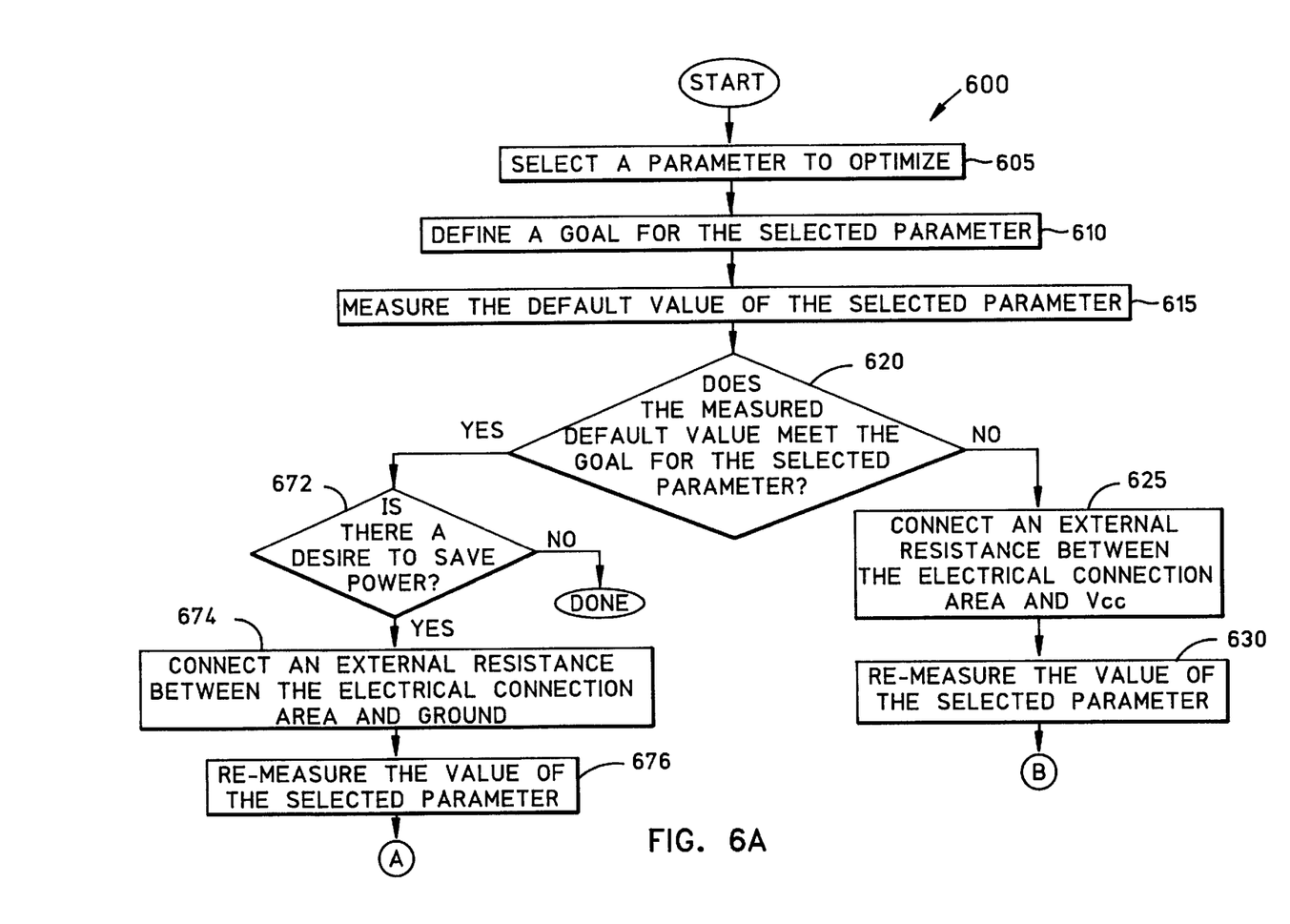
FIGS. 6A–6C are a flow chart of a method for optimizing a circuit parameter in an integrated circuit device having an electrical connection area, in accordance with an illustrative embodiment of the invention.
Figure 6B:
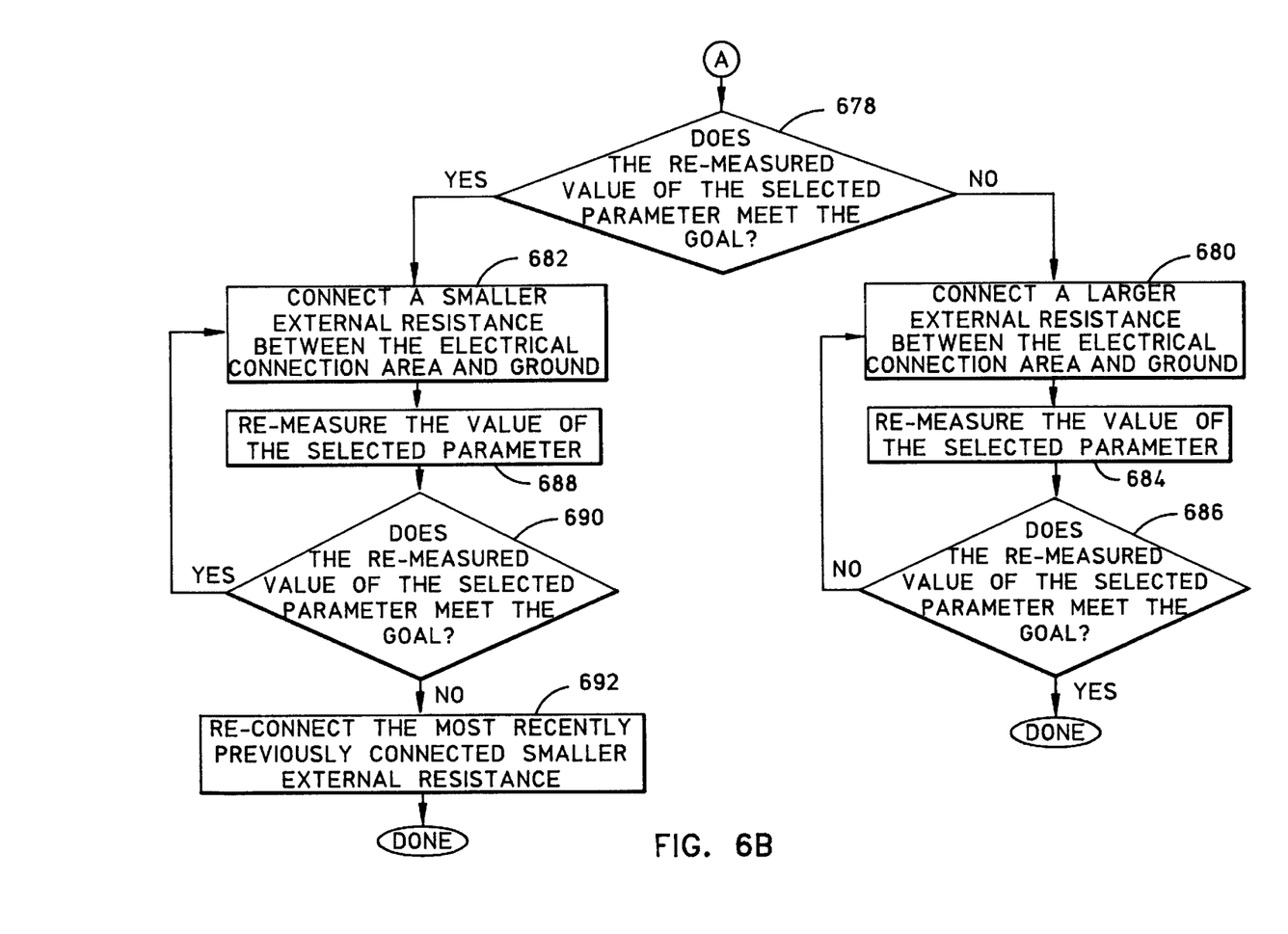
Figure 6C:
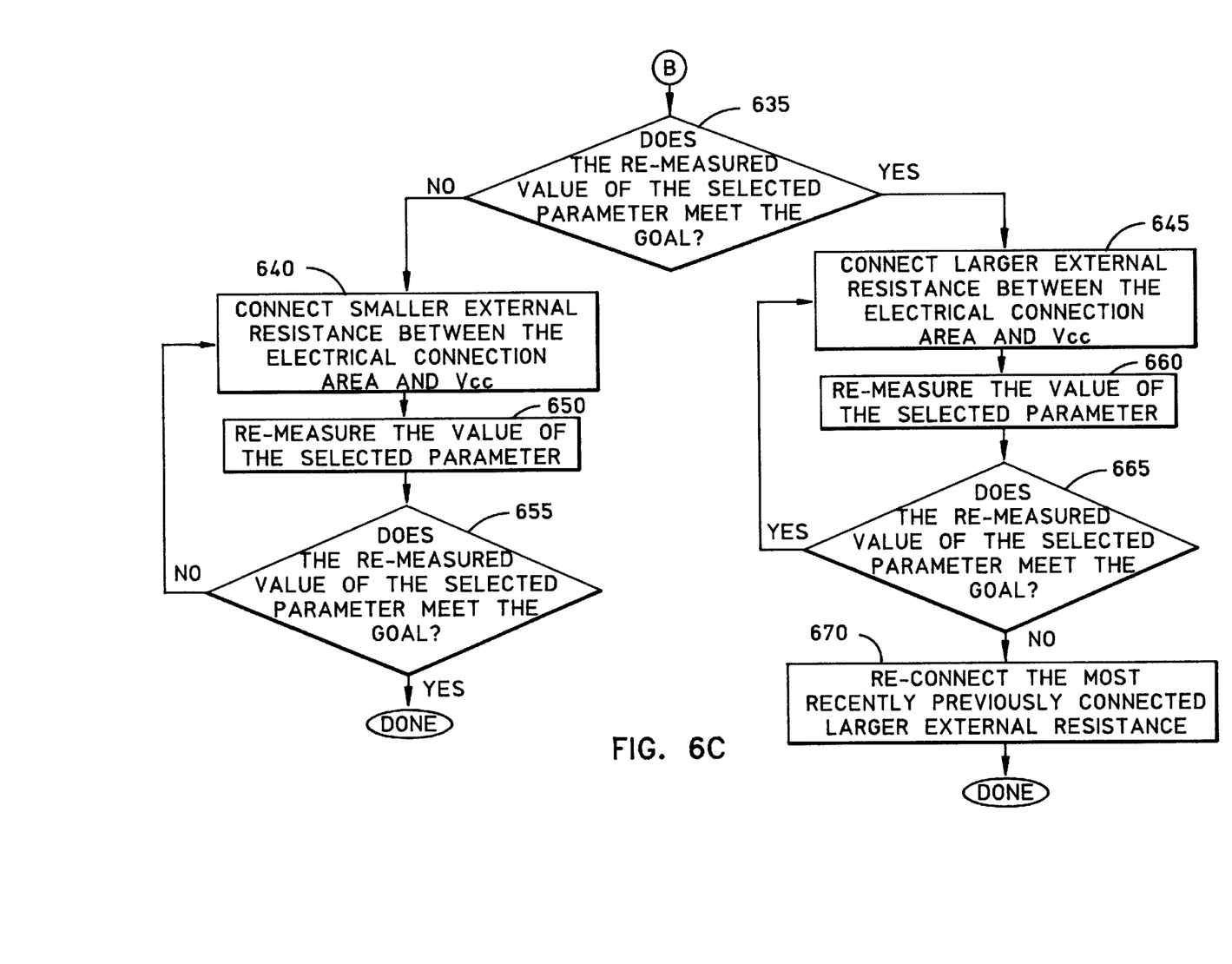

In task 620, the measured default value of the selected parameter is compared to the goal for the selected parameter, in order to determine if the default value of the selected parameter meets the goal that has been defined for the selected parameter. If the measured default value of the selected parameter does not meet the goal for the selected parameter, then in task 625, an external resistance is connected between the electrical connection area 225 and Vcc, in order to increase the output current and to cause the selected circuit parameter to move closer to, or to exceed the goal. For example, if the measured propagation delay is longer than the goal minimum propagation delay, the propagation delay can be shortened by increasing the output current, which is accomplished by connecting the external resistance between the electrical connection area and Vcc. Similarly, if the waveform integrity is less than the goal, for example if waveform transitions are not sufficiently sharp, then the speed of transitions can be increased by increasing the output current, which is accomplished by connecting the external resistance between the electrical connection area and Vcc. Similarly, if the amount of jitter is greater than the maximum jitter goal, then jitter can be reduced by increasing the output current, which is accomplished by connecting the external resistance between the electrical connection area and Vcc.

Determining the amount of external resistance that is ultimately to be connected between the electrical connection area 225 and the reference voltage in order to produce the desired output current is determined by a heuristic process in which a resistance value is initially selected, an equivalent resistor is connected, and one or more desired performance parameters are measured. If the parameter value or values do not meet a desired magnitude, another resistance value is selected, and so on, until the desired performance, as indicated by the parameter values, is reached. Such parameters could include (but are not limited to), for example, propagation delay, waveform integrity, and jitter. Although not required, preferably, the resistance values are chosen to change the voltage at the electrical connection area a small amount, for example about 0.1 volts, each time a different resistance is connected to the electrical connection area.

To continue the heuristic process, in task 630 the value of the selected parameter is re-measured. For example, the propagation delay is again measured, but this time with the external resistance connected between the electrical connection area and Vcc. In task 635, it is determined whether the re-measured value of the selected parameter meets the goal for the selected parameter. If the re-measured value of the selected parameter does not meet the goal for the selected parameter, then as illustrated in task 640, a smaller external resistance than is presently connected is connected between the electrical connection area and Vcc. Conversely, if the re-measured value of the selected parameter meets the goal for the selected parameter then as illustrated in task 645, a larger external resistance than is presently connected is connected between the electrical connection area and Vcc.

If task 640, in which a smaller external resistance is connected between the electrical connection area and Vcc, has been performed, then tasks 650 and 655 are performed. In task 650 the value of the selected parameter is again re-measured, and in task 655 it is again determined whether the re-measured value of the selected parameter meets the goal for the selected parameter. If in task 655 it is determined that the re-measured value of the selected parameter does not meet the goal for the selected parameter, then task 640 is again performed and a smaller external resistance than the external resistance presently connected is connected between the electrical connection area and Vcc. After task 640 is performed, tasks 650 and 655 are again performed. Tasks 640, 650, and 655 are repeated until it is determined in task 655 that the re-measured value of the selected parameter meets the goal. If in task 655 it is determined that the remeasured value of the selected parameter meets the goal, then the method is completed.

If task 645, in which a larger external resistance is connected between the electrical connection area and Vcc, has been performed, then tasks 660 and 665 are performed. In task 660 the value of the selected parameter is again re-measured, and in task 665 it is again determined whether the re-measured value of the selected parameter meets the goal for the selected parameter. If in task 665 it is determined that the re-measured value of the selected parameter meets the goal for the selected parameter, then task 645 is again performed and a larger external resistance than the external resistance presently connected is connected between the electrical connection area and Vcc. After task 645 is performed, tasks 660 and 665 are again performed. Tasks 645, 660, and 665 are repeated until it is determined in task 665 that the re-measured value of the selected parameter does not meet the goal.

If in task 665 it is determined that the re-measured value of the selected parameter does not meet the goal, then task 670 is performed, in which the most recently previously connected larger external resistance is again connected between the electrical connection area and Vcc in place of the resistance presently connected. After task 670 is performed, the method is completed.

If in task 620 it is determined that the measured default value of the selected parameter meets the goal for the selected parameter, then task 672 is performed. In task 672 it is determined if there is a desire to save power. If in task 672 it is determined that there is not a desire to save power, then the method is completed. If in task 672 it is determined that there is a desire to save power, then task 674 is performed. In the subsequent tasks of this method the output current is generally reduced as much as it can be reduced without reducing the value of the selected parameter below the goal for the selected parameter. In task 674, an external resistance is connected between the electrical connection area and ground. Connecting the external resistor to ground rather than Vcc results in a decrease in the output current, and consequent power savings. In task 676, the value of the selected parameter is again re-measured. In task 678 it is determined whether the re-measured value of the selected parameter meets the goal for the selected parameter.

If the re-measured value of the selected parameter does not meet the goal for the selected parameter, then task 680 is performed. In task 680 an external resistance that is larger than the resistance presently connected is connected between the electrical connection area and ground.

If the re-measured value of the selected parameter meets the goal for the selected parameter, then task 682 is performed. In task 682 an external resistance that is smaller than the resistance presently connected is connected between the electrical connection area and ground.

If task 680, in which a larger external resistance is connected between the electrical connection area and ground, has been performed, then tasks 684 and 686 are performed. In task 684 the value of the selected parameter is again re-measured, and in task 686 it is again determined whether the re-measured value of the selected parameter meets the goal for the selected parameter. If in task 686 it is determined that the re-measured value of the selected parameter does not meet the goal for the selected parameter, then task 680 is again performed and a larger external resistance than the external resistance presently connected is connected between the electrical connection area and ground.

After task 680 is performed, tasks 684 and 686 are again performed. Tasks 680, 684, and 686 are repeated until it is determined in task 686 that the re-measured value of the selected parameter meets the goal. If in task 686 it is determined that the re-measured value of the selected parameter meets the goal, then the method is completed.

If task 682, in which a smaller external resistance is connected between the electrical connection area and ground, has been performed, then tasks 688 and 690 are performed. In task 688 the value of the selected parameter is again re-measured, and in task 690 it is again determined whether the re-measured value of the selected parameter meets the goal for the selected parameter. If in task 690 it is determined that the re-measured value of the selected parameter meets the goal for the selected parameter, then task 682 is again performed and a smaller external resistance than the external resistance presently connected is connected between the electrical connection area and ground. After task 682 is performed, tasks 688 and 690 are again performed. Tasks 682, 688, and 690 are repeated until it is determined in task 690 that the re-measured value of the selected parameter does not meet the goal. If in task 690 it is determined that the re-measured value of the selected parameter does not meet the goal, then task 692 is performed. In task 692, the most recently previously connected smaller external resistance is again connected between the electrical connection area and ground in place of the resistance presently connected. After task 692 is performed, the method is completed.

The output current is a function of the bias voltage produced by the variable bias generator. If a current source such as first current source 205 (which includes current source resistor R3) or second current source 240 (which includes current source resistor R4) is used, then the output current is also a function of the value of the current source resistor.

The bias voltage produced by the variable bias generator is a function of the amount of external resistance connected between the electrical connection area 225 and the reference voltage (which, although not required, is Vcc or ground in the method described above). (In an alternative embodiment, the reference voltage could also be varied to control the value of the bias voltage). The amount of external resistance to be connected in order to produce the desired bias voltage is a function of the circuitry used for the variable bias generator. For the integrated circuit device 300 of FIG. 3, the output currents as a function of the bias voltage are closely approximated by the following formulas, given that the external resistor is connected to ground. Of course, those skilled in the art will be able to adapt these equations to the case where the resistor is connected to a non-ground voltage value, for example Vcc. With the external resistor connected to ground, the output currents are:

$$I301=(V_{BIAS}-V_{beQ7})/R3; I302=(V_{BIAS}-V_{beQ8})/R4,$$

where $V_{BIAS}$=the bias voltage, $V_{beQ7}$ is the base-emitter voltage of transistor Q7, and $V_{beQ8}$ is the base-emitter voltage of transistor Q8.

For the variable bias generator 310 in FIG. 3, the bias voltage as a function of the external resistance is closely approximated by the following formula:

$$V_{BIAS}=(1+R6/R7)((kT/q)\ln(I_{CQ9}/I_{SQ9})),$$

wherein $I_{CQ9}=((Vcc-V_{BIAS})/R5)-(V_{BIAS}/R_{EXT})-((kT/q)\ln(I_{CQ9}/I_{SQ9})(1/R_7))$, and where $V_{BIAS}$ is the bias voltage, $I_{CQ9}$ is the collector current of transistor Q9, "ln" is the mathematical operator for the natural logarithm, k is Boltzmann's constant (1.38×10 exp-23 J/K), T is the temperature in degrees Kelvin, q is the charge of an electron (1.602×10 exp-19 C), $I_{SQ9}$ is the saturation current of transistor Q9, and $R_{EXT}$ is the value of the resistance used for the external programming circuit.

For the integrated circuit device 300 (which includes the variable bias generator 310), the output currents as a function of the external resistance are closely approximated by the following formulas:

$$I301=(V_{BIAS}-V_{beQ7})/R3; I302=(V_{BIAS}V_{beQ8})/R4,$$

where $V_{BIAS}$ is determined as indicated above.

For the variable bias generator 405 in FIG. 4A, the bias voltage as a function of the external resistance closely approximated by the following formula:

$$V_{BIAS}=(1+(R9/R10))((kT/q)\ln(I_{CQ10}/I_{SQ10})),$$

wherein $I_{CQ10}=((Vcc-V_{N1})/R8)-(V_{N1}/R_{EXT})-((1/R10)(kT/q)\ln(I_{CQ10}/I_{SQ10}))$, and where N1 is the node designated "N1" in FIG. 4A, $V_{N1}$ is the voltage at node N1, and $I_{SQ10}$ is the saturation current of transistor Q10.

When the variable bias generator 405 is used in the integrated circuit device 300 instead of the variable bias generator 310, the output currents as a function of the external resistance are closely approximated by the following formulas:

$$I301=(V_{BIAS}-V_{beQ7})/R3; I302=(V_{BIAS}--V_{beQ8})/R4,$$

where $V_{BIAS}$ is determined for variable bias generator 405 as indicated above. Persons of ordinary skill in the art will be able to derive similar equations for the circuits of FIGS. 4B and 4C.

B. External Voltage

Another aspect of the invention is another method for optimizing a circuit parameter in an integrated circuit device having an electrical connection area. For this method, the external programming circuit 230 of FIG. 2 is an external voltage source. This method is illustrated by the tasks 700 of the flowchart in FIGS. 7A and 7B. In task 705, a circuit parameter that is influenced by the emitter follower output current is selected to be optimized. Although this method is described in terms of optimizing one parameter, optionally, more than one parameter can be optimized. Circuit parameters that may be optimized include (but are not limited to), for example, propagation delay, waveform integrity, and/or jitter. In task 710, a goal or target value for the selected parameter is defined (established). In task 715, a benchmark measurement of circuit performance is obtained by measuring the default value of the selected parameter. In task 720, the voltage on the electrical connection area is measured.

Figure 7A:
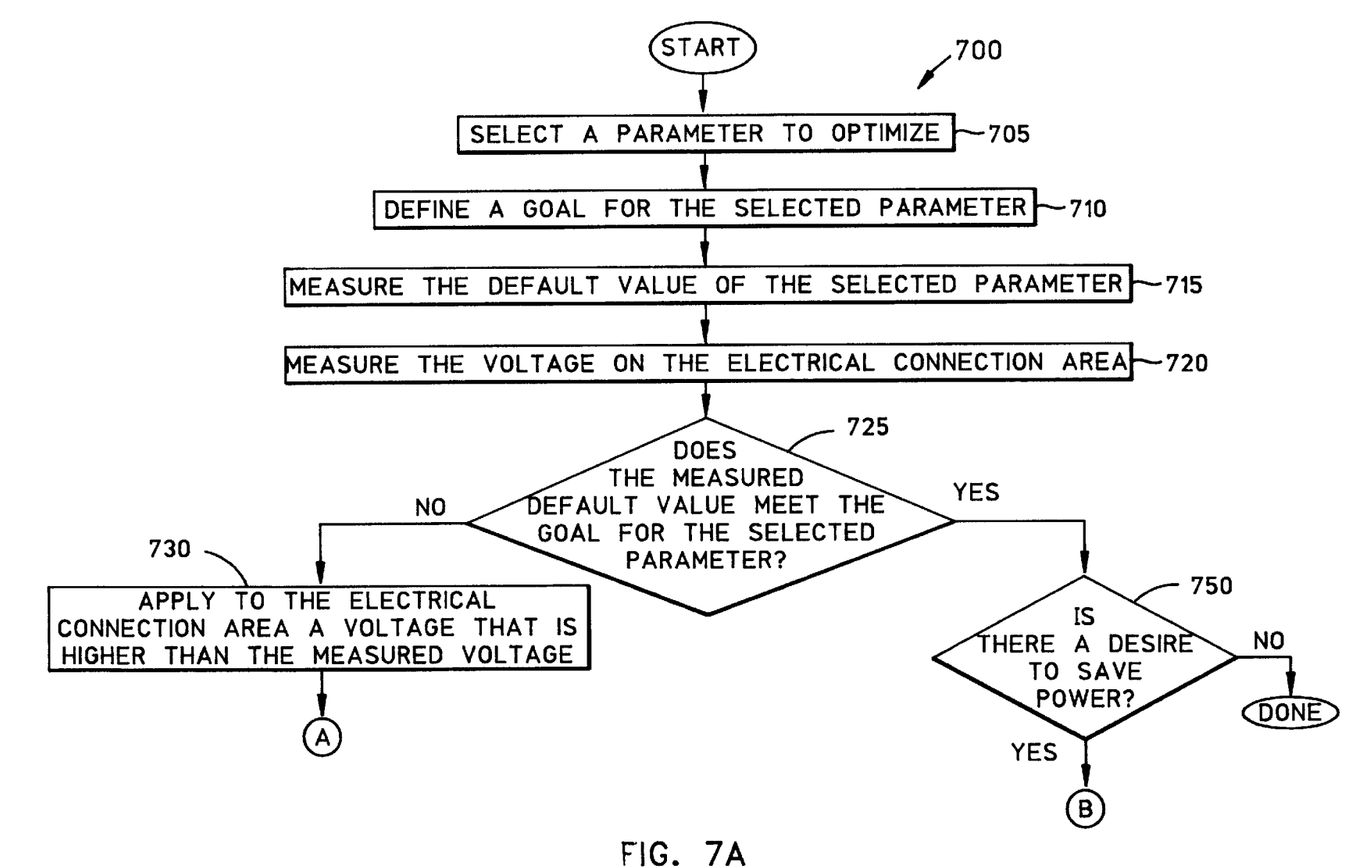
FIGS. 7A–7B are a flow chart of a method for optimizing a circuit parameter in an integrated circuit device having an electrical connection area, in accordance with another illustrative embodiment of the invention.
Figure 7B:
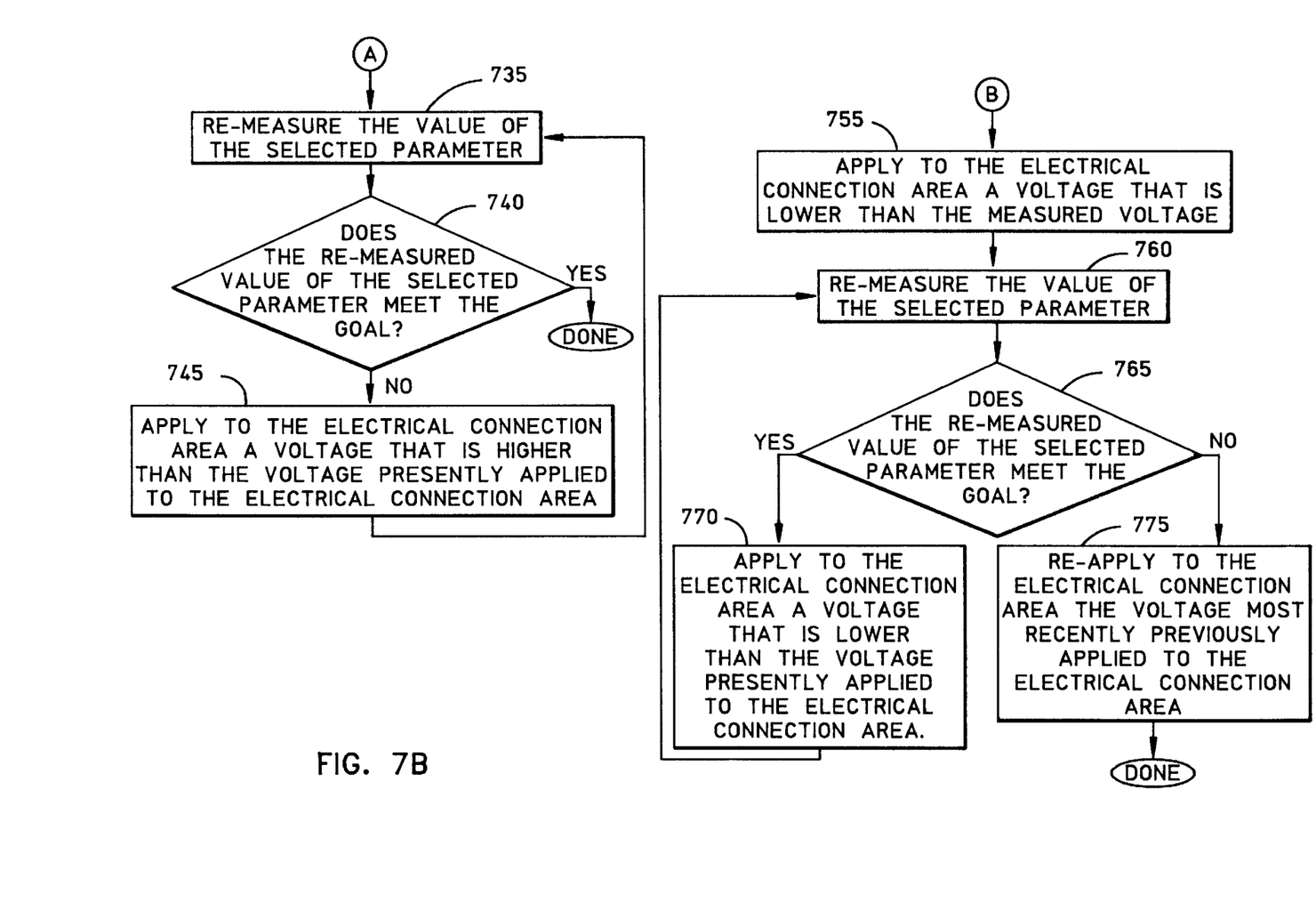

In task 725, the measured default value of the selected parameter is compared to the goal for the selected parameter, in order to determine if the default value of the selected parameter meets the goal that has been defined for the selected parameter. If the measured default value of the selected parameter does not meet the goal for the selected parameter, then in task 730, a voltage that is higher than the voltage measured on the electrical connection is applied to the electrical connection area. Applying a higher voltage to the electrical connection area increases the output current thereby causing the selected circuit parameter to move closer to, or exceed the goal. For example, if the measured propagation delay is longer than the goal minimum propagation delay, the propagation delay can be shortened by increasing the output current, which is accomplished by applying a higher voltage to the electrical connection area. Similarly, if the waveform integrity is less than the goal, for example if waveform transitions are not sufficiently sharp, then the speed of transitions can be increased by increasing the output current, which is accomplished by applying a higher voltage to the electrical connection area. Similarly, if the amount of jitter is greater than the maximum jitter goal, then jitter can be reduced by increasing the output current, which is accomplished by applying a higher voltage to the electrical connection area.

A heuristic process is used to determine the amount of voltage that is ultimately to be applied to the electrical connection area 225 in order to produce the desired output current. Accordingly, a voltage is applied to the electrical connection area, and one or more desired performance parameters are measured. If the parameter value or values do not meet a desired magnitude, another voltage applied, and so on, until the desired performance, as indicated by the parameter values, is reached. Such parameters could include (but are not limited to), for example, propagation delay, waveform integrity, and jitter. Although not required, preferably, when the method requires the voltage applied to the electrical connection area to be larger or smaller than the presently applied voltage, the voltage applied is only a small amount different, for example about 0.1 volts, than the presently applied voltage.

To continue the heuristic process, in task 735, the value of the selected parameter is re-measured. For example, the propagation delay is again measured, but this time with a voltage connected to the electrical connection area that is higher than the measured default value of the voltage of the electrical connection area. In task 740, it is determined whether the re-measured value of the selected parameter meets the goal for the selected parameter. If the re-measured value of the selected parameter meets the goal for the selected parameter then the method is completed. If the re-measured value of the selected parameter does not meet the goal for the selected parameter, then as illustrated in task 745, a voltage that is higher than the voltage presently applied to the electrical connection area is applied to the electrical connection area. If task 745 is performed, then tasks 735 and 740 are again performed. Tasks 745, 735, and 740 are repeated until it is determined in task 740 that the re-measured value of the selected parameter meets the goal for the selected parameter. If in task 740 it is determined that the re-measured value of the selected parameter meets the goal for the selected parameter, then the method is completed.

If in task 725 it is determined that the measured default value of the selected parameter meets the goal for the selected parameter, then task 750 is performed. In task 750 it is determined if there is a desire to save power. If in task 750 it is determined that there is not a desire to save power, then the method is completed. If in task 750 it is determined that there is a desire to save power, then task 755 is performed. In the subsequent tasks of this method the output current is generally reduced as much as it can be reduced without reducing the value of a selected circuit parameter below the goal (also referred to as the target) for the selected parameter. In task 755, a voltage that is lower than the default voltage measured on the electrical connection area is applied to the electrical connection area. Applying the lower voltage to the electrical connection area results in a decrease in the output current, and consequent power savings. In task 760, the value of the selected parameter is again re-measured. In task 765 it is determined whether the re-measured value of the selected parameter meets the goal for the selected parameter.

If the re-measured value of the selected parameter meets the goal for the selected parameter, then as illustrated in task 770, a voltage that is lower than the voltage presently applied to the electrical connection area is applied to the electrical connection area. If task 770 is performed, then tasks 760 and 765 are again performed. Tasks 770, 760, and 765 are repeated until it is determined in task 765 that the re-measured value of the selected parameter does not meet the goal for the selected parameter.

If in task 765 it is determined that the re-measured value of the selected parameter does not meet the goal for the selected parameter, then task 775 is performed. In task 775, the voltage most recently previously applied to the electrical connection area is again applied to the electrical connection area. After task 775 is performed, the method is completed.

The output current is a function of the bias voltage produced by the variable bias generator. In the case of the circuit 300 of FIG. 3, the bias voltage will be equal to the external voltage connected to the electrical connection area, with the external voltage effectively overriding the default bias voltage produced by the variable bias generator 310. For the integrated circuit device 300 of FIG. 3, the bias voltage equals the external voltage, and the output current of the first emitter follower output section 302 as a function of the external voltage is closely approximated by the following formula:

$$I301=(V_{EXT}-V_{beQ7})/R3,$$

where $V_{EXT}$ is the external voltage connected to the electrical connection area. Similarly, the output current of the second emitter follower output section 335 as a function of the external voltage is closely approximated by the following formula: $I302=(V_{EXT}-V_{beQ8})/R4$.

For the variable bias generator 405 in FIG. 4, the bias voltage as a function of the external voltage is given by the following formula: $V_{BIAS}=V_{EXT}-V_{beQ12}$. When the variable bias generator 405 is used in the circuit 300 instead of the variable bias generator 310, the output current of the first emitter follower output section 302 as a function of the external voltage is closely approximated by the following formula:

$$I301=(V_{EXT}-V_{beQ12}-V_{beQ7})/R3.$$

Similarly, the output current of the second emitter follower output section 335 as a function of the external voltage is closely approximated by the following formula:

$$I302=(V_{EXT}-V_{beQ12}-V_{beQ8})/R4.$$

Persons of ordinary skill in the art will be able to derive similar formulas for the circuits of FIGS. 4B and 4C.

For embodiments of the invention where an external voltage is always connected to the electrical connection area 225, the variable bias generator need not include anything more than a connection between the electrical connection area 225 and the bias voltage inputs of any current sources to be controlled by the external voltage.

OTHER EMBODIMENTS AND CONCLUSION

The invention can be implemented in a variety of digital logic families, for example ECL, CMOS and NMOS. Although the invention has been described in terms of digital circuitry, the invention could also be used for programming the output current in an analog circuit, with the output current being determined, for example, as a function of the desired slew rate.

Illustrative embodiments of the invention, including what are presently considered to be the preferred embodiments of the invention, have been described herein. It will be apparent to those skilled in the art that various changes and modifications can be made without departing from the scope of the invention as defined by the appended claims. Consequently, it is not intended that the invention should be limited to only the embodiments discussed above. Rather, the invention should be limited only by the scope of the claims.

What is claimed is:

1. An integrated circuit device adapted for connection to an external programming circuit, the integrated circuit device comprising:

a first output transistor having an emitter;

a first current source connected in series with the emitter of the first output transistor, the first current source having a bias voltage input for controlling the amount of current through the first current source;

a variable bias generator having an output, the variable bias generator producing a bias voltage at the output of the variable bias generator, the output of the variable bias generator being connected to the bias voltage input of the first current source for controlling the amount of current through the first current source;

wherein the variable bias generator includes:

a variable bias generator first resistor having a first end connected to a first voltage and a second end connected to the electrical connection area;

a variable bias generator second resistor having a first end and a second end, the first end being connected to the electrical connection area;

a variable bias generator third resistor having a first end and a second end, the first end being connected to the second end of the variable bias generator second resistor, the second end being connected to a second voltage;

a variable bias generator first transistor having a collector, a base, and an emitter, the collector being connected to the electrical connection area, the base being connected to the second end of the variable bias generator second resistor and the first end of the variable bias generator third resistor, the emitter being connected to the second voltage, and wherein the output of the variable bias generator is connected to the electrical connection area; and a variable bias generator capacitor having a first end connected to the electrical connection area, and a second end connected to the second reference voltage; and an electrical connection area connected to the variable bias generator, the electrical connection area being configured for connection to the external programming circuit for setting the amount of bias voltage at the output of the variable bias generator and programming the amount of current through the first current source.

2. The integrated circuit device of claim 1 wherein the first current source comprises:

a first current source transistor having a base and an emitter; and a first current source resistor connected to the emitter of the first current source transistor; and wherein the base of the first current source transistor is the bias voltage input of the first current source.

3. The integrated circuit device of claim 2 further comprising:

a second output transistor having an emitter; and a second current source connected in series with the emitter of the second output transistor, the second current source having a bias voltage input, the output of the variable bias generator being connected to the bias voltage input of the second current source for controlling the amount of current through the second current source, the electrical connection area being configured for connection to the external programming circuit for setting the amount of the bias voltage at the output of the variable bias generator and programming the amount of current through the second current source.

4. The integrated circuit device of claim 3 wherein the second current source comprises:

a second current source transistor having a base and an emitter; and a second current source resistor connected to the emitter of the second current source transistor; and wherein the base of the second current source transistor is the bias voltage input of the second current source.

5. The integrated circuit device of claim 4 further comprising:

at least one additional output transistor having an emitter; and an additional current source corresponding with each additional output transistor, each additional current source being connected in series with the emitter of the corresponding additional output transistor, each additional current source having a bias voltage input, the output of the variable bias generator being connected to the bias voltage input of each additional current source for controlling the amount of current through each additional current source, the electrical connection area being configured for connection to the external programming circuit for setting the amount of the bias voltage at the output of the variable bias generator and programming the amount of current through each current source.

6. The integrated circuit device of claim 4:

wherein the first current source transistor has a collector and wherein the emitter of the first output transistor is connected to the collector of the first current source transistor at a first output node; and wherein the second current source transistor has a collector and wherein the emitter of the second output transistor is connected to the collector of the second current source transistor at a second output node.

7. The integrated circuit device of claim 6 wherein a first output signal is produced at the first output node, and wherein a second output signal is produced at the second output node, and wherein the first output signal is the logical compliment of the second output signal.

8. The integrated circuit device of claim 7 wherein the external programming circuit comprises a resistance.

9. The integrated circuit device of claim 7 wherein the external programming circuit comprises an external voltage source.

10. An integrated circuit device adapted for optional connection to an external programming circuit, the integrated circuit device comprising:

at least one circuit, with at least one of the circuits comprising:

at least one emitter follower output section, each emitter follower output section comprising an output transistor having an emitter, and a current source connected in series with the emitter of the output transistor, the current source having a bias voltage input for controlling the amount of current through the current source; and a variable bias generator having an output connected to the bias voltage input of each current source, the variable bias generator being configured to produce a bias voltage at the output of the variable bias generator, the value of the bias voltage produced when there is an external programming circuit connected to the variable bias generator being predictable and useful for controlling the amount of current through each current source, the value of the bias voltage produced when there is no external programming circuit connected to the variable bias generator also being predictable and useful for controlling the amount of current through each current source;

wherein the variable bias generator includes:

a variable bias generator first resistor having a first end connected to a first voltage and a second end connected to the electrical connection area;

a variable bias generator second resistor having a first end and a second end, the first end being connected to the electrical connection area;

a variable bias generator third resistor having a first end and a second end, the first end being connected to the second end of the variable bias generator second resistor, the second end being connected to a second voltage;

a variable bias generator first transistor having a collector, a base, and an emitter, the collector being connected to the electrical connection area, the base being connected to the second end of the variable bias generator second resistor and the first end of the variable bias generator third resistor, the emitter being connected to the second voltage, and wherein the output of the variable bias generator is connected to the electrical connection area; and a variable bias generator capacitor having a first end connected to the electrical connection area, and a second end connected to the second reference voltage; and an electrical connection area connected to the variable bias generator, the electrical connection area being configured for optional connection of the external programming circuit to the electrical connection area, so that when the external programming circuit is connected to the electrical connection area the bias voltage at the output of the variable bias generator is set to a value other than the default bias voltage to program the amount of current through each current source to an amount other than the default amount of current.

11. The integrated circuit device of claim 10 wherein each current source comprises:

a current source transistor having an emitter; and a current source resistor connected in series with the emitter of the current source transistor.

12. The integrated circuit device of claim 11 wherein each current source transistor has a base, and wherein the base of each current source transistor is the bias voltage input of the corresponding current source.

13. The integrated circuit device of claim 12 wherein each output transistor has a base, and wherein the base of each output transistor is the input of the corresponding emitter follower output section.

14. The integrated circuit device of claim 13 wherein each current source transistor has a collector and wherein the emitter of each output transistor is connected to the collector of the corresponding current source transistor at an output node that is the output of the corresponding emitter follower output section.

15. The integrated circuit device of claim 14 wherein there are at least two emitter follower output sections, and wherein the outputs of at least two of the emitter follower output sections are logical compliments.

16. An integrated circuit device adapted for optional connection to an external programming circuit, the integrated circuit device comprising:

at least one circuit, with at least one of the circuits comprising:

at least one emitter follower output section, each emitter follower output section comprising an output transistor having an emitter, and a current source connected in series with the emitter of the output transistor, the current source having a bias voltage input for controlling the amount of current through the current source; and a variable bias generator having an output connected to the bias voltage input of each current source, the variable bias generator being configured to produce a bias voltage at the output of the variable bias generator, the value of the bias voltage produced when there is an external programming circuit connected to the variable bias generator being predictable and useful for controlling the amount of current through each current source, the value of the bias voltage produced when there is no external programming circuit connected to the variable bias generator also being predictable and useful for controlling the amount of current through each current source; and wherein the variable bias generator comprises:

a variable bias generator first resistor having a first end connected to a first voltage and a second end connected to the electrical connection area;

a variable bias generator second resistor having a first end and a second end, the first end being connected to the electrical connection area;

a variable bias generator third resistor having a first end and a second end, the first end being connected to the second end of the variable bias generator second resistor;

a variable bias generator first transistor having a collector, a base, and an emitter, the collector being connected to the electrical connection area, the base being connected to the second end of the variable bias generator second resistor and the first end of the variable bias generator third resistor;

a variable bias generator second transistor having a collector, a base, and an emitter, the collector and the base being connected to the emitter of the variable bias generator first transistor, the emitter being connected to a second voltage;

a variable bias generator third transistor having a collector, a base, and an emitter, the collector being connected to the first voltage, the base being connected to the electrical connection area;

a variable bias generator fourth transistor having a collector, a base, and an emitter, the collector being connected to the emitter of the variable bias generator third transistor, the base being connected to the base of the variable bias generator second transistor, the emitter being connected to the second voltage, and wherein the output of the variable bias generator is connected to the emitter of the variable bias generator third transistor; and a variable bias generator capacitor having a first end connected to the collector of the variable bias generator fourth transistor, and a second end connected to the second reference voltage; and an electrical connection area connected to the variable bias generator, the electrical connection area being configured for optional connection of the external programming circuit to the electrical connection area, so that when the external programming circuit is connected to the electrical connection area the bias voltage at the output of the variable bias generator is set to a value other than the default bias voltage to program the amount of current through each current source to an amount other than the default amount of current.

17. The integrated circuit device of claim 16 wherein the external programming circuit comprises a resistance.

18. The integrated circuit device of claim 16 wherein the external programming circuit comprises an external voltage source.

19. An integrated circuit device adapted for optional connection to an external programming circuit, the integrated circuit device comprising:

at least one circuit, with at least one of the circuits comprising:

at least one emitter follower output section, each emitter follower output section comprising an output transistor having an emitter, and a current source connected in series with the emitter of the output transistor, the current source having a bias voltage input for controlling the amount of current through the current source; and a variable bias generator having an output connected to the bias voltage input of each current source, the variable bias generator being configured to produce a bias voltage at the output of the variable bias generator, the value of the bias voltage produced when there is an external programming circuit connected to the variable bias generator being predictable and useful for controlling the amount of current through each current source, the value of the bias voltage produced when there is no external programming circuit connected to the variable bias generator also being predictable and useful for controlling the amount of current through each current source;

wherein the variable bias generator comprises:

a variable bias generator first resistor having a first end connected to a first voltage and a second end connected to the electrical connection area;

a variable bias generator second resistor having a first end and a second end, the first end of the variable bias generator second resistor being connected to the electrical connection area;

a variable bias generator capacitor having a first end and a second end, the first end of the variable bias generator capacitor being connected to the second end of the variable bias generator second resistor;

a variable bias generator first transistor having a collector, a base, and an emitter, the collector of the variable bias generator first transistor being connected to the first end of the variable bias generator capacitor, the base of the variable bias generator first transistor being connected to the second end of the variable bias generator capacitor, and the emitter of the variable bias generator first transistor being connected to the second reference voltage;

a variable bias generator second transistor having a collector, a base, and an emitter, the collector of the variable bias generator second transistor being connected to the first reference voltage, and the base of the variable bias generator second transistor being connected to the electrical connection area, and the emitter of the variable bias generator second transistor being connected to the output of the variable bias generator;

a variable bias generator third resistor having a first end and a second end, the first end of the variable bias generator third resistor being connected to the emitter of the variable bias generator second transistor;

a variable bias generator third transistor having a collector, a base, and an emitter, the collector of the variable bias generator third transistor being connected to the second end of the variable bias generator third resistor and being connected to the second end of the variable bias source capacitor;

a variable bias generator fourth resistor having a first end and a second end, the first end of the variable bias generator fourth resistor being connected to the emitter of the variable bias generator third transistor, and the second end of the variable bias generator fourth resistor being connected to the second reference voltage;

a variable bias generator fifth resistor having a first end and a second end, the first end of the variable bias generator fifth resistor being connected to the emitter of the variable bias generator second transistor, the second end of the variable bias generator fifth resistor being connected to the base of the third variable bias generator transistor; and a variable bias generator diode having an anode and a cathode, the anode of the variable bias generator diode being connected to the base of the third variable bias generator transistor, the cathode of the variable bias generator diode being connected to the second reference voltage; and an electrical connection area connected to the variable bias generator, the electrical connection area being configured for optional connection of the external programming circuit to the electrical connection area, so that when the external programming circuit is connected to the electrical connection area the bias voltage at the output of the variable bias generator is set to a value other than the default bias voltage to program the amount of current through each current source to an amount other than the default amount of current.

20. An integrated circuit device adapted for optional connection to an external programming circuit, the integrated circuit device comprising:

at least one circuit, with at least one of the circuits comprising:

at least one emitter follower output section, each emitter follower output section comprising an ouput transistor having an emitter, and a current source connected in series with the emitter of the output transistor, the current source having a bias voltage input for controlling the amount of current through the current source; and a variable bias generator having an output connected to the bias voltage input of each current source, the variable bias generator being configured to produce a bias voltage at the output of the variable bias generator, the value of the bias voltage produced when there is an external programming circuit connected to the variable bias generator being predictable and useful for controlling the amount of current through each current source, the value of the bias voltage produced when there is no external programming circuit connected to the variable bias generator also being predictable and useful for controlling the amount of current through each current source;

wherein the variable bias generator comprises:

a first variable bias generator resistor having a first end connected to the first reference voltage, and a second end connected to the electrical connection area and to the output of the variable bias generator;

a variable bias generator diode having an anode and a cathode, the anode being connected to the electrical connection area;

a variable bias generator second resistor having a first end and a second end, the first end of the variable bias generator second resistor being connected to the cathode of the variable bias generator diode, the second end of the variable bias generator second resistor being connected to the second reference voltage; and a variable bias generator capacitor having a first end and a second end, the first end of the variable bias generator capacitor being connected to the electrical connection area, the second end of the variable bias generator capacitor being connected to the second reference voltage; and an electrical connection area connected to the variable bias generator, the electrical connection area being configured for optional connection of the external programming circuit to the electrical connection area so that when the external programming circuit is connected to the electrical connection area the bias voltage at the output of the variable bias generator is set to a value other than the default bias voltage to program the amount of current through each current source to an amount other than the default amount of current.

21. The integrated circuit device of claim 19 wherein the external programming circuit comprises a resistance.

22. The integrated circuit device of claim 19 wherein the external programming circuit comprises an external voltage source.

23. The integrated circuit device of claim 20 wherein the external programming circuit comprises a resistance.

24. The integrated circuit device of claim 20 wherein the external programming circuit comprises an external voltage source.

* * * * *